United States Patent [19]
Paoli

[11] Patent Number: 5,963,568
[45] Date of Patent: Oct. 5, 1999

[54] MULTIPLE WAVELENGTH, SURFACE EMITTING LASER WITH BROAD BANDWIDTH DISTRIBUTED BRAGG REFLECTORS

[75] Inventor: Thomas L. Paoli, Los Altos, Calif.

[73] Assignee: Xerox Corporation, Stamford, Conn.

[21] Appl. No.: 08/674,062

[22] Filed: Jul. 1, 1996

[51] Int. Cl.[6] .............................. H01S 3/10; H01S 3/19; H01S 3/08
[52] U.S. Cl. .................. 372/23; 372/50; 372/96
[58] Field of Search .................... 372/50, 96, 23

[56] References Cited

U.S. PATENT DOCUMENTS

| | | | |
|---|---|---|---|
| 5,206,872 | 4/1993 | Jewell et al. | 372/50 |
| 5,319,655 | 6/1994 | Thornton | 372/50 |
| 5,386,428 | 1/1995 | Thornton et al. | 372/50 |
| 5,425,043 | 6/1995 | Holonyak, Jr. et al. | 372/50 |
| 5,465,263 | 11/1995 | Bour et al. | 372/23 |

*Primary Examiner*—Rodney Bovernick
*Assistant Examiner*—Quyen Phan Leung
*Attorney, Agent, or Firm*—William Propp

[57] ABSTRACT

A multiple wavelength surface emitting laser has a first and second broad bandwidth distributed Bragg reflector (DBR) which reflect light at multiple wavelengths. The surface emitting laser structure comprises at least two cavities with each cavity containing one or more active layers for respectively emitting light at different wavelengths. In a preferred embodiment for a dual wavelength surface emitting laser, a first cavity contains a first active layer for emitting light of a first wavelength and a second cavity contains the first and second active layers and emits only light of the second longer wavelength. The second layer has been eliminated in the first cavity by etching before completing the epitaxial growth.

30 Claims, 5 Drawing Sheets

MULTIPLE WAVELENGTH, SURFACE EMITTING LASER WITH BROAD BANDWIDTH DISTRIBUTED BRAGG REFLECTORS

BACKGROUND OF THE INVENTION

This invention relates to a multiple wavelength, surface emitting laser and, more particularly, to a multiple wavelength surface emitting laser with broad bandwidth Distributed Bragg Reflectors (DBRs) to reflect beams of the multiple wavelengths.

Addressable monolithic multiple wavelength light sources, such as laser arrays that can simultaneously emit light beams of different wavelengths from different elements in the array, are useful in a variety of applications, such as color printing, full color digital film recording, color displays, and other optical recording system applications.

Individually, semiconductor light emitting diodes and semiconductor lasers may have insufficient power for some of those applications. Arrays of semiconductor light emitting diodes or semiconductor lasers can be used to increase the total power output, to provide parallel processing, and to simplify optical system design. Arrays have been fabricated so that the light emitting elements are on a single semiconductor substrate in a monolithic structure to provide and maintain good optical alignment of the light emitting elements of the array with one another and to minimize the assembly involved.

One problem with such arrays is maintaining the electrical and optical isolation between the individual light emitting elements. Another problem is increasing the density of the light emitting elements in the substrate by closely spacing the elements together while still maintaining the isolation, avoiding heat dissipation problems, and providing precise alignment of the elements.

Yet another problem is making each individual light emitting element in the array independently addressable. As the light emitting elements are spaced closer together in higher densities, it is progressively more difficult to separately, individually and independently cause each element to emit light.

Also working against the high density is the requirement that the individual closely spaced emitted light beams be easy to separate or detect. Typically, beam separation is accomplished by having the array simultaneously emit light beams of different wavelengths from different elements in the array.

A dual wavelength laser has two active layers for emitting light at two different wavelengths in U.S. Pat. No. 5,708,674, commonly assigned as the present application and herein incorporated by reference. Impurity induced layer intermixing removes a portion of the narrower bandgap, longer wavelength active layer to allow the wider bandgap, shorter wavelength active layer to emit light. However, the dual wavelength laser of that invention is an edge emitter.

Semiconductor lasers are typically edge emitters. The light is emitted from the edge of a monolithic structure of semiconductor layers. An alternative construction is surface emitters where the light is emitted from the surface of the monolithic structure of semiconductor layers.

Surface emitting semiconductor light sources have several advantages over edge emitters. The light emitting surface of a surface emitter is larger than that of an edge emitter. A surface emitter needs less power to emit light than an edge emitter. Fabrication of surface emitting lasers can be less complex than fabrication of edge emitting lasers since the cleaving and mirror passivation needed for edge emitters are eliminated. A higher density of laser emitters is possible with a surface emitting source than an edge emitting source.

A surface skimming laser does use multiple active layers to emit a partial vertical beam in addition to an edge emitted beam in U.S. Pat. No. 5,319,655, commonly assigned as the present application and herein incorporated by reference. However, the laser structure has a single active layer which emits light of a first wavelength, an active layer deposited on another active layer where only the top active layer which has the shorter bandgap will emit light of a second wavelength and an active layer deposited on two other active layers where only the top active layer which has the shortest bandgap will emit light of a third wavelength. And, as noted, the light is emitted both vertically and through the edge thus dividing the optical power of the beam. A surface skimming laser also radiates vertically over an area too large to allow high density.

U.S. Pat. No. 5,319,655 also uses the surface skimming structure as a basis for a multiple wavelength vertical cavity surface emitting laser. However, each laser in this structure contains one, two or three active layers sandwiched between distributed Bragg reflectors (DBR) with no separations between the active layers or between the active layer and the upper DBR. Although the active layer in the laser with one active layer is positioned at the peak of the optical standing wave established by reflections from the DBRs, the radiating active layer in the laser containing two active layers is misaligned with that laser's optical standing wave. Similarly, the radiating active layer in the laser containing three active layers is even more misaligned with that laser's optical standing wave. Thus the surface emitting lasers taught in the patent are inefficient and have an excessively high threshold or are restricted to closely spaced wavelengths. Since poor efficiency and high threshold cause poor optical performance in laser arrays with closely spaced emitters, e.g. excessive power droop and excessive crosstalk between lasers, arrays of multiple wavelength surface emitting lasers must be designed with minimum threshold and maximum efficiency in order to be useful in optical recording applications.

It is an object of the invention to provide a monolithic structure of independently addressable, high density, multiple wavelength surface emitting lasers with broad bandwidth DBRs and improved performance.

It is another object of the invention to provide a monolithic structure of independently addressable, high density, multiple wavelength surface emitting lasers with multiple active layers for emitting light of different wavelengths.

It is yet another object of this invention to provide a monolithic structure of multiple wavelength surface emitting lasers with multiple active layers for emitting light of different wavelengths where etching removes a portion of a narrower bandgap, longer wavelength active layer to allow a wider bandgap, shorter wavelength active layer to emit light.

SUMMARY OF THE INVENTION

In accordance with the present invention, a multiple wavelength surface emitting laser has a first and second broad bandwidth distributed Bragg reflector (DBR) which reflect light at multiple wavelengths. The surface emitting laser structure comprises at least two cavities with each cavity containing one or more active layers for respectively emitting light at different wavelengths. In a preferred embodiment for a dual wavelength surface emitting laser, a first cavity contains a first active layer for emitting light of a first wavelength and a second cavity contains the first and second active layers and emits only light of the second longer wavelength. The second layer has been eliminated in the first cavity by etching before completing the epitaxial growth.

Other objects and attainments together with a fuller understanding of the invention will become apparent and appreciated by referring to the following description and claims taken in conjunction with the accompanying drawings.

DESCRIPTION OF THE PREFERRED EMBODIMENT

Figure 1:
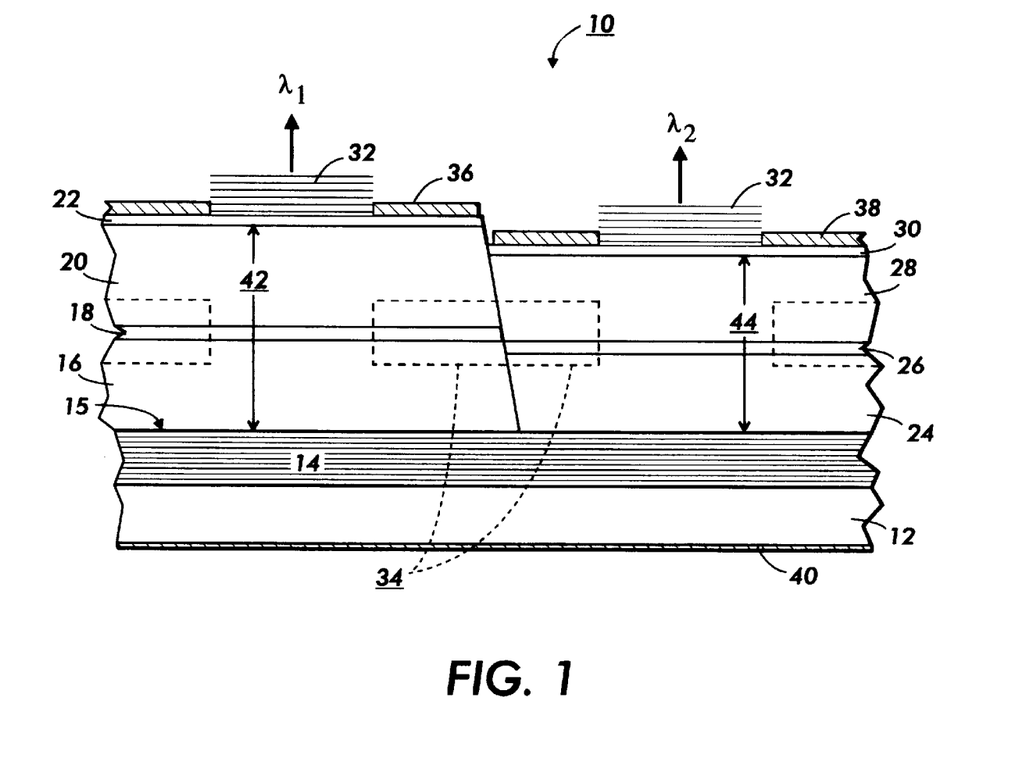
FIG. 1 is a schematic illustration of a cross-section side view of a high density, dual wavelength, surface emitting monolithic laser structure with broad bandwidth Distributed Bragg Reflectors formed according to the present invention.

Reference is now made to FIG. 1, wherein there is illustrated a high density, independently addressable, dual wavelength, surface emitting monolithic laser structure 10 as a first embodiment of this invention. The monolithic laser structure 10 can be fabricated with a technique such as metalorganic chemical vapor deposition (MOCVD) as is well known in the art. In this embodiment, the monolithic laser structure 10 is fabricated with a multiple-step (selective) growth procedure. The structure 10 comprises a substrate 12 of n-GaAs upon which is first epitaxially deposited a first or lower broad bandwidth DBR 14 of alternating layers of n-$Al_{0.5}Ga_{0.5}As$ and n-AlAs, a first etch stop layer 15 of n-GaInP which is nominally 5 nm thick, a first lower spacer layer 16 of n-$(Al_xGa_{1-x})_{0.5}In_{0.5}P$ (0.5<x<1.0) which is 20 to 200 nm thick, a first active layer configuration 18 of GaAs/AlGaAs, which is 8 to 400 nm thick depending on the number of active quantum wells, barriers, and confinement layers in the configuration, a first upper spacer layer 20 of p-$(Al_xGa_{1-x})_{0.5}In_{0.5}P$ (0.5<x<1.0) which is 20 to 200 nm thick, and a contact/capping layer 22 of p-GaAs or p-$Ga_{0.5}In_{0.5}P$ which is nominally 5 nm thick. The thicknesses of the first lower spacer layer 16 and first upper spacer layer 20 are chosen such that the active layer configuration 18 is located at a peak of the optical standing wave in the $\lambda_1$ cavity 42. It is convenient but not necessary to grow the longest wavelength structure first.

Following the first epitaxy, the layers are locally etched down to the etch stop layer 15, through a patterned mask, for example of $SiO_2$ or $Si_3N_4$. With the mask remaining in place to serve further as a mask for selective epitaxial growth, the layers for the right-hand laser 44 are epitaxially deposited in the etched regions, thus creating side-by-side laser structures at different wavelengths. The layers grown in the second epitaxy are a second lower spacer layer 24 of n-$(Al_xGa_{1-x})_{0.5}In_{0.5}P$ (0.5<x<1.0) which is 20 to 200 nm thick, a second active layer configuration 26 of GaInP/AlGaInP or GaAs/AlGaAs, which is 8 to 400 nm thick depending on the number of active quantum wells, barriers, and confinement layers in the configuration, a second upper spacer layer 28 of p-$(Al_xGa_{1-x})_{0.5}In_{0.5}P$ (0.5<x<1.0) which is 20 to 200 nm thick, and a contact/capping layer 30 of p-GaAs or p-$Ga_{0.5}In_{0.5}P$ which is nominally 5 nm thick. The thicknesses of the second lower spacer layer 24 and second upper spacer layer 28 are chosen such that the active layer configuration 26 is located at a peak of the optical standing wave in the $\lambda_2$ cavity 44. Subsequent to the growth of the right-hand layers, the growth mask is removed and the second or upper broad bandwidth DBR 32 of alternating layers of n-$Al_{0.5}Ga_{0.5}As$ and n-AlAs are grown over both laser cavities. The upper DBR is then laterally patterned in order to expose contact layers 22 and 30 and the lateral confinement structure is formed by one of several techniques known in the art. Our preferred embodiment uses proton implantation regions 34 to confine the injection current since this process is applicable to both AlGaAs/GaAs and AlGaInP/GaInP materials. Subsequent to forming the current confinement channels, contacts are formed to the first and second laser cavities by depositing contact metals 36 and 38 respectively. Alternatively, the lateral laser structures 42 and 44 can be formed before the deposition of the upper DBR.

Standard evaporation techniques are employed to form metal contacts to the first and second lasers 42 and 44. The p-side or upper side of the first laser cavity 42 is contacted over the non-etched portion of the structure with an annular metal contact 36 of Cr—Au or Ti—Pt—Au on the top surface of the contact/capping layer 22. The p-side or upper side of the second laser cavity 44 is contacted over the etched and regrown portion of the structure with an annular metal contact 38 of Cr—Au or Ti—Pt—Au on the top surface of the contact/capping layer 30. Contact 40 to the n-side or lower side of the second laser cavity 44 is provided by an alloyed Au—Ge metallization, followed by Cr—Au or Ti—Pt—Au, on the bottom surface of the substrate 12. Contact 40 is common to both laser cavities 42 and 44.

The broad bandwidth DBR 14 consists of 60 to 120 alternating layers of n-$Al_{0.5}Ga_{0.5}As$ and n-AlAs. For example, the DBR may be a 60 quarter-wave stack at the design wavelength which is usually taken to be the mean of $\lambda_1$ and $\lambda_2$ in the semiconductor. The thicknesses of the semiconductor layers are a quarter of the wavelength or nominally 50 nm for red and infrared wavelengths. The first or lower n-DBR 14 will be approximately 3 microns thick. DBRs of this type are described by R. P. Schneider, et al., in *IEEE Photonics Technology Letters*, vol 6, pp 313–316 (March 1994).

The second or upper p-DBR 32 can be similar to the first or lower n-DBR 14, except with an undoped, not n, conductivity type. Thus, this broad bandwidth DBR 32 will reflect at the wavelengths of light emitted from both the first active layer and the second active layer. Beneficially the broad bandwidth DBR 32 consists of 10 to 20 alternating layers of $Al_{0.5}Ga_{0.5}As$ and AlAs oxide similar to that described by M. H. MacDougal, et al., in *IEEE Photonics Technology Letters,* vol 7, pp 229–231 (March 1995). For example, the DBR may be a 10 quarter-wave stack at the design wavelength. The thicknesses of the $Al_{0.5}Ga_{0.5}As$ and oxidized AlAs layers are a quarter of the wavelength which is nominally 50 nm in the $Al_{0.5}Ga_{0.5}As$ and nominally 120 nm in the oxidized AlAs. The second or upper p-DBR will be approximately 0.85 microns thick.

An advantage of this structure is that the active and spacer layers for the left and right lasers can be individually optimized for each wavelength. A further advantage is that the thicknesses of the spacer layers can be independently adjusted such that each active layer configuration is located at a peak of the optical standing wave in its respective cavity.

The first laser cavity 42 is under the non-etched portion within the monolithic structure 10 and consists of the contact/capping layer 22, the first upper spacer layer 20, the first active layer configuration 18, the first lower spacer layer 16 and the first etch stop layer 15.

The second laser cavity 44 is under the etched portion within the monolithic structure 10 and consists of the second upper spacer layer 28, the second active layer configuration 26, the second lower spacer layer 24 and the etch stop layer 15.

The first active layer configuration 18 of GaAs/AlGaAs has a narrower bandgap than the second active layer configuration 26 of GaInP/AlGaInP or GaAs/AlGaAs and thus the first active layer 18 will lase at a longer first wavelength than the second active layer 26. In this illustrative example, the first active layer of GaAs or AlGaAs will lase in the infrared.

The second active layer configuration 26 of GaInP/AlGaInP or GaAs/AlGaAs has a wider bandgap than the first active layer configuration 18 of GaAs/AlGaAs and thus the second active layer 26 will lase at a shorter second wavelength than the first active layer 18. In this illustrative example, the second active layer of GaInP will lase in the red.

Voltage applied to the first contact 36 and the common contact 40 will cause the first active layer 18 of the first laser cavity 42 to emit light of a first wavelength through the upper DBR 32. The first cavity 42 only contains the first active layer 18.

Voltage applied to the second contact 38 and the common contact 40 will cause the second active layer 26 of the second laser cavity 44 to emit light of a second wavelength through the upper DBR 32. The second cavity 44 only contains the second active layer 26.

Each laser in structure 10 of FIG. 1 contains only one active layer designed for emission at the appropriate wavelength.

The laser cavity length in an edge emitter laser is many thousands of times the wavelength of the emitted light. Exacting precision in the laser cavity length is thus not critical in an edge emitter. On the contrary, the laser cavity length in a surface emitter laser is only a small single digit or low double digit multiple of the wavelength of the emitted light.

Accordingly, the thicknesses of the confinement spacer layers are chosen to place each of the active quantum wells of the first and second active layers at the peak of the cavity's standing wave corresponding to the wavelength emitted by each quantum well. This matching of wavelength and laser cavity length avoids nulls and phase mismatching of the emitted light beam.

Thus, the first active layer 18 is physically positioned in the first cavity 42 at the peak of the standing wave of the infrared wavelength that the first active layer emits. And, the second active layer 26 is physically positioned in the second cavity 44 at the peak of the standing wave of the red wavelength that the second active layer emits. The first and second active layers may be positioned at the peak of their respective standing waves by locating each active layer at the center of its cavity. Alternatively, the active layers may be positioned at the peak of its standing wave by using a cavity length that is 2 times the wavelength in the semiconductor and placing the active layer at ¼ of the cavity length below the upper DBR. Other asymmetric arrangments are possible for cavities that are integer multiples of the wavelength.

The first active quantum well layer 18 can alternatively comprise GaAsP, InGaAsP, or AlGaAsP, all materials which emit light in the infrared spectrum. Alternatively, the single active quantum wells can be replaced by multiple quantum wells separated by appropriate barrier layers as is well known in the art. Also the upper DBR and lower DBR can comprise alternating layers of AlInP and AlGaInP.

Figure 2:
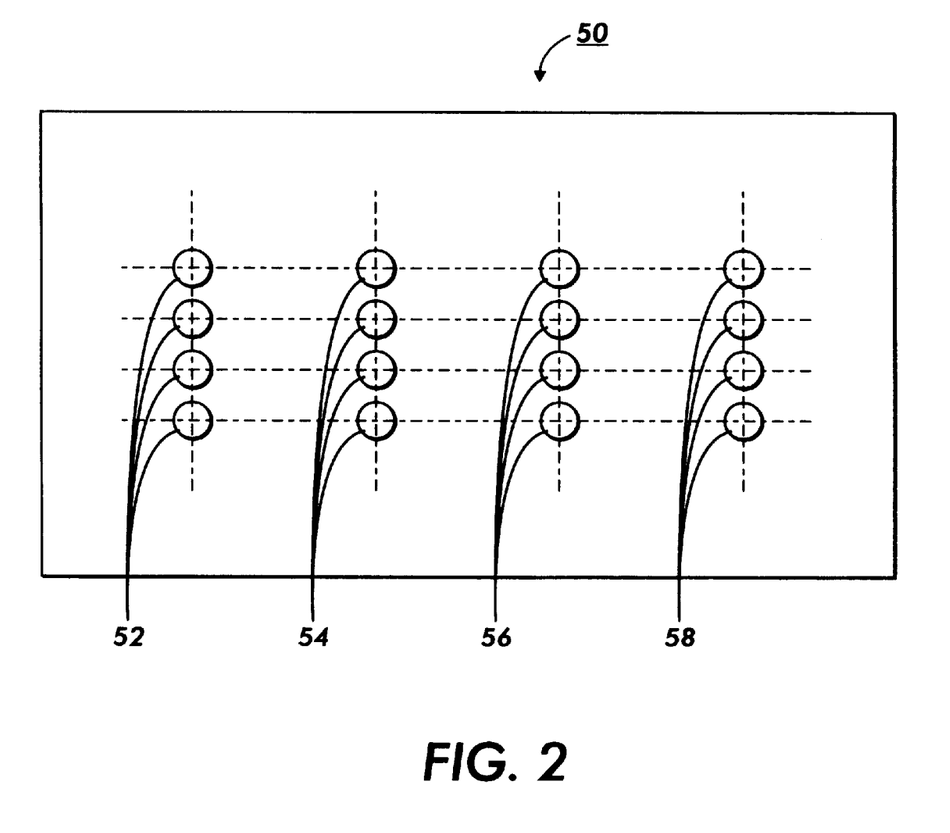
FIG. 2 is a schematic illustration of a top view of a multiple wavelength surface emitting monolithic laser structure formed according to the present invention.

In particular, a preferred arrangement of multiple wavelength surface emitting lasers is laser structure 50, shown schematically in top view in FIG. 2. For this arrangement, laser elements 52 emit light at wavelength $\lambda_1$, laser elements 54 emit light at shorter wavelength $\lambda_2$, laser elements 56 emit light at still shorter wavelength $\lambda_3$, and laser elements 58 emit light at the shortest wavelength $\lambda_4$. Laser elements at each wavelength are spaced closer than the groups. Typically laser elements at each wavelength are separated by 10 to 50 $\mu$m from each other, while the groups at different wavelengths are separated by 100 to 500 $\mu$m from each. Multiple wavelength arrays of surface emitting lasers of this configuration are especially useful in printing architectures taught in U.S. Pat. No. 5,243,359, commonly assigned as the present application and herein incorporated by reference.

The laser array structure 50 of FIG. 2 can be a nonmonolithic combination of two high density, independently addressable, dual wavelength, surface emitting monolithic laser structures 10 of FIG. 1. Each monolithic structure contains two linear arrays of VCSELs emitting at two different wavelengths.

Figure 3:
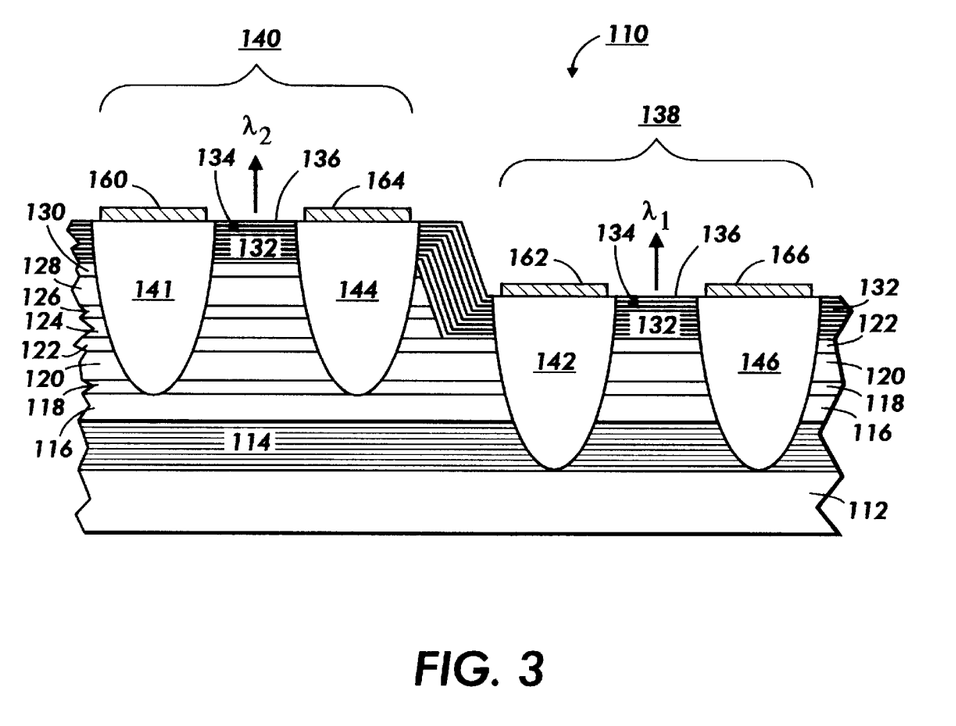
FIG. 3 is a schematic illustration of a cross-section side view of a second embodiment of a high density, dual wavelength, surface emitting monolithic laser structure with broad bandwidth Distributed Bragg Reflectors and with same side electrodes formed according to the present invention.

Reference is now made to FIG. 3, wherein there is illustrated a high density, independently addressable, dual wavelength, surface emitting monolithic laser structure 110 as a second embodiment of this invention.

The monolithic laser structure 110 can be fabricated by a technique such as metalorganic chemical vapor deposition (MOCVD) as is well known in the art. In this embodiment, the monolithic laser structure 110 comprises a substrate 112 of semi-insulating GaAs upon which is epitaxially deposited a first or lower broad bandwidth DBR 114 of alternating undoped layers of $Al_{0.5}Ga_{0.5}As$ and undoped AlAs, a first or lower spacer layer 116 of undoped $Al_xGa_{1-x}As$ (0.5<x<0.8) which is 20 to 200 nm thick, a first or lower active quantum well layer 118 of GaAs, which is 8 to 10 nm thick, a second or lower intermediate spacer layer 120 of undoped $Al_xGa_{1-x}As$ (0.5<x<0.8) which is 20 to 200 nm thick, an etch stop layer 122 of GaAs or GaInP which is nominally 5 nm thick, a third or upper intermediate spacer layer 124 of undoped $Al_xGa_{1-x}As$ (0.5<x<0.8) which is 20 to 200 nm thick, a second or upper active quantum well layer 126 of $Al_yGa_{1-y}As$ (0<y<0.3) which is 8 to 10 nm thick, a fourth or upper spacer layer 128 of undoped $Al_xGa_{1-x}As$ (0.5<x<0.8) which is 20 to 200 nm thick, and a protective layer 130 of GaAs or GaInP which is 4 to 10 nm thick.

The second active layer 126 is selectively removed from a portion of the monolithic laser structure 10 by stopping after the growth of the protective layer 130 for etching. Following the first epitaxy, the layers are locally etched down to the +top of the etch stop layer 122 through a patterned mask, for example of $SiO_2$ or $Si_3N_4$. The etching selectively removes portions of the protective layer 130, upper spacer layer 128, the upper active quantum well layer 126 and the upper intermediate spacer layer 124. The thin etch stop layer 122 of GaAs or GaInP embedded below the upper intermediate spacer layer 124 serves as an etch stop layer and a protective layer for the subsequent regrowth in the etched region. Similarly, the protective layer 130 provides an Al-free surface on which to regrow the upper DBR 132 after selectively etching.

Formation of the monolithic laser structure 110 continues after the etching with removal of the mask and epitaxial deposition upon the protective layer 130 of the non-etched portion and upon the etch stop layer 122 of the etched portion of a second or upper broad bandwidth DBR 132 of alternating layers of $Al_{0.5}Ga_{0.5}As$ and AlAs, followed by a cap layer 134 of GaAs which is 5 to 100 nm thick with a top surface 136.

After completion of the regrowth, surface emitting laser cavities 138 and 140 are formed by one of several techniques well known in the art. For example, a preferred embodiment is to form the laser cavities with impurity induced layer disordering as taught in U.S. Pat. No. 5,608,753, commonly assigned as the present application and herein incorporated by reference.

The first laser cavity 138 is under the etched portion within the monolithic structure 110 and consists of the etch stop layer 122, the lower intermediate spacer layer 120, the first active quantum well layer 118, and the lower spacer layer 116.

The second laser cavity 140 is under the protective layer 130 of the non-etched portion within the monolithic structure 110 and consists of the protective layer 130, the upper spacer layer 128, the second active quantum well layer 126, the upper intermediate spacer layer 124, the etch stop layer 122, the lower intermediate spacer layer 120, the first active quantum well layer 118, and the lower spacer layer 116.

The first and second laser cavities are defined within the epitaxially deposited layers by semi-annular cathodes 140 and 142 and semi-annular anodes 144 and 146. The cathodes 140 and 142 comprise an n-type wide bandgap material formed by impurity induced layer disordering of the as-grown multiple layers and serve as the electron source for the undoped active layers 126 and 118, respectively. The anodes 144 and 146 comprise a p-type wide bandgap material formed by impurity induced layer disordering of the as-grown multiple layers and serve as the hole source for the undoped active layers 126 and 118, respectively. The cathodes 140 and 142 and the anodes 144 and 146 beneficially extend through the upper DBR 132 and into the lower spacer layer 116 or the lower DBR 114 to form respectively cylindrical optical waveguide for the surface emitting laser cavities 140 and 138. Proton bombardment (not shown) provides electrical isolation between the cathode 140 and the anode 144 and between the cathode 142 and the anode 146 as taught in U.S. Pat. No. 5,455,429, commonly assigned as the present application and herein incorporated by reference.

Electrical connections are made to lasers 138 and 140 through the cathode metal contacts 160 and 162, which are connected to the cathodes 140 and 142 and the anode metal contacts 164 and 166 which are connected to the anodes 144 and 146. Standard techniques are employed as well known in the art to form ohmic metal contacts on the top surface 136.

The first active layer 118 of AlGaAs has a wider bandgap than the second active layer 126 of GaAs and thus the first active layer 118 will lase at a shorter first wavelength than the second active layer 126. In this illustrative example, the first active layer of AlGaAs will lase at 780 nm.

The second active layer 126 of GaAs has a narrower bandgap than the first active layer 118 of AlGaAs and thus the second active layer 126 will lase at a longer second wavelength than the first active layer 118. In this illustrative example, the second active layer of GaAs will lase at 830 nm.

The first or lower DBR 114 of alternating layers of $Al_{0.5}Ga_{0.5}As$ and AlAs will reflect a broad bandwidth of wavelengths. This broad bandwidth DBR will reflect the wavelengths of light emitted from both the first active layer and the second active layer. In the present illustrative example, the DBR will reflect light at least from 760 nm to 840 nm.

The broad bandwidth DBR 114 consists of 60 to 120 alternating layers of n-$Al_{0.5}Ga_{0.5}As$ and AlAs. It is designed to have a reflectivity at either wavelength as close to one as possible. For example, the DBR may be a 60 quarter-wave stack at the design wavelength which is taken to be the mean of $\lambda_1$ and $\lambda_2$ in the semiconductor. The thicknesses of the semiconductor layers are a quarter of the wavelength or nominally 56 nm for the illustrative wavelengths. The first or lower DBR 114 will be approximately 3.5 microns thick. DBRs of this type are described by R. P. Schneider, et al., in *IEEE Photonics Technology Letters*, vol 6, pp 313–316 (March 1994).

The second or upper DBR 132 is similar to the first or lower DBR 114, except that its reflectivity is chosen to be close to one but less than that of the lower DBR 114. Thus, this broad bandwidth DBR 132 will also reflect the wavelengths of light emitted from both the first active layer and the second active layer. The broad bandwidth DBR 132 consists of 30 to 60 alternating layers of $Al_{0.5}Ga_{0.5}As$ and AlAs. For example, the DBR may be a 40 quarter-wave stack at the design wavelength. The thicknesses of the semiconductor layers are a quarter of the wavelength or nominally 56 nm. The second or upper DBR will be approximately 2.1 microns thick.

Voltage applied to the second cathode contact 162 and the second anode contact 166 will cause the first active quantum well layer 118 of the first laser cavity 138 to emit light of a first wavelength through the first emission window 148 in the top surface 136 of the monolithic structure 110. The first cavity 138 contains only the first active quantum well layer 118.

Voltage applied to the first cathode contact 160 and the first anode contact 164 will cause the second active quantum well layer 126 of the second laser cavity 140 to emit light of a second wavelength through the second emission window 150 in the top surface 136 of the monolithic structure 110.

The second laser cavity 140 contains both the first active quantum well layer 118 and the second active quantum well layer 126. However, only the second active quantum well layer 126 will emit light.

With current applied to both active layers, the second cavity 140 will emit light at the second longer wavelength from the second active layer 126 because the second active layer has the narrower bandgap and the injected carriers preferentially populate the lowest energy active layer in the structure, i.e. the narrower bandgap active layer. The first active quantum well layer 118 is transparent to the light at the second wavelength.

The first or lower DBR 114 is constructed to have a reflectivity as close to one as possible while the second or upper DBR 132 is constructed with a reflectivity close to one but less than that of the first DBR.

The light is emitted through the upper broad bandwidth DBR 132, substantially perpendicular to the top surface 136 of the top layer 134, hence monolithic laser structure 110 is a surface emitting laser. The emitted light can be either continuous wave or pulse.

The laser cavity length in an edge emitter laser is many thousands of times the wavelength of the emitted light. Exacting precision in the laser cavity length is thus not critical in an edge emitter. On the contrary, the laser cavity length in a surface emitter laser is only a small single digit or low double digit multiple of the wavelength of the emitted light.

Accordingly, the thicknesses of the spacer layers 116, 120, 124, and 128 are chosen to place each of the active quantum wells of the first and second active layers at or near the peak of the cavity's standing wave corresponding to the wavelength emitted by each quantum well. This matching of wavelength and laser cavity length avoids nulls and phase mismatching of the emitted light beam.

Thus, the first active layer 118 is physically positioned in the first cavity 138 at the peak of the standing wave at the wavelength that the first active layer emits. And the second active layer 126 is physically positioned in the second cavity 140 at the peak of the standing wave at the wavelength that the second active layer emits. The first and second active layers may be positioned at the peak of their respective standing waves by locating each active layer at the center of its cavity. Alternatively, the second active layer may be positioned at the peak of its standing wave by using a cavity length that is 2 times the wavelength in the semiconductor and placing the active layer at ¼ of the cavity length below the upper DBR. Other asymmetric arrangments are possible for cavities that are integer multiples of the wavelength.

The first and second laser cavities can be electrically and optically isolated from each other by etching a groove between the two cavities (not shown) or by proton bombardment of the region between the two cavities. In embodiments where carrier injection is lateral between the anode and cathode as described in FIG. 3, no additional electrical isolation may be required since the layers are undoped.

Alternatively, the single active quantum wells can be replaced by multiple quantum wells separated by appropriate barrier layers as is well known in the art.

Figure 4:
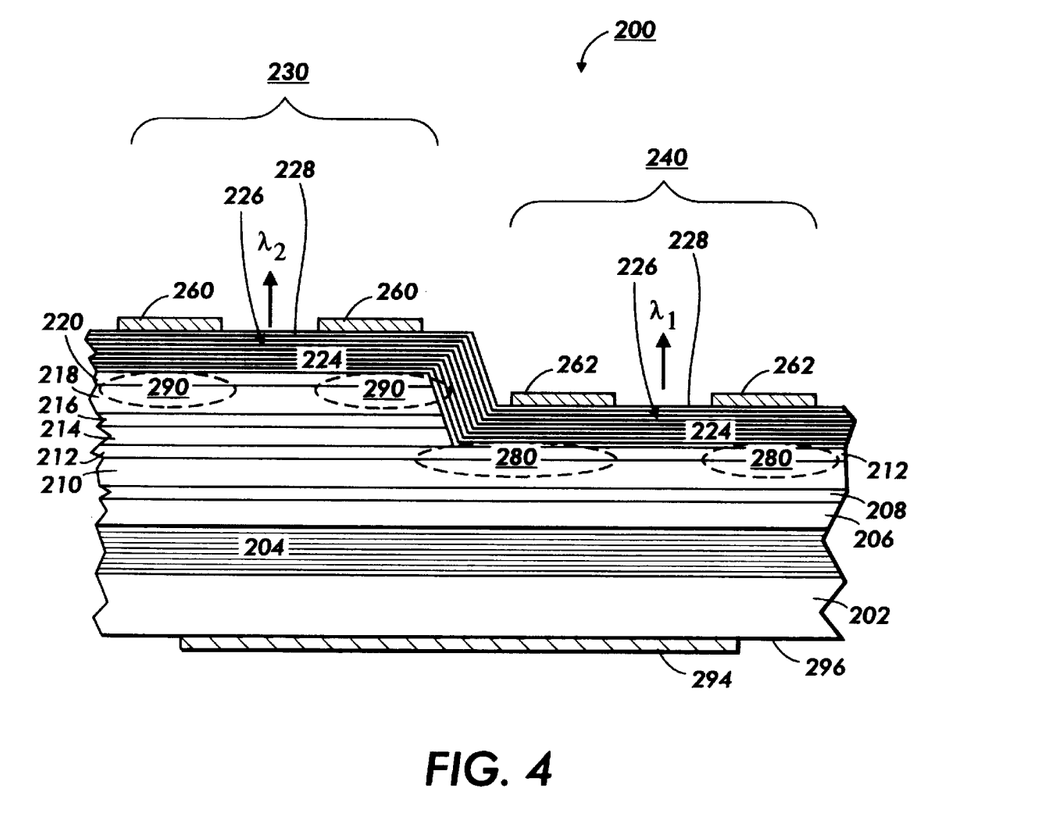
FIG. 4 is a schematic illustration of a cross-section side view of a third embodiment of a high density, dual wavelength, surface emitting monolithic laser structure with broad bandwidth Distributed Bragg Reflectors and with multiple active layers in one laser cavity formed according to the present invention.

Reference is now made to FIG. 4, wherein there is illustrated a high density, independently addressable, dual wavelength, surface emitting monolithic laser structure 200 as a third embodiment of this invention.

The monolithic laser structure 200 can be fabricated by a technique such as metalorganic chemical vapor deposition (MOCVD) as is well known in the art. In this embodiment, the monolithic laser structure 200 comprises a substrate 202 of n-GaAs upon which is epitaxially deposited a first or lower broad bandwidth DBR 204 of alternating layers of n-$Al_{0.5}Ga_{0.5}As$ and n-AlAs, a first or lower spacer layer 206 of n-$(Al_xGa_{1-x})_{0.5}In_{0.5}P$ (0.5<x<1.0) which is 20 to 200 nm thick, a first or lower active quantum well layer 208 of $Ga_zIn_{1-z}P$, which is 8 to 10 nm thick, a second or lower intermediate spacer layer 210 of p-$(Al_xGa_{1-x})_{0.5}In_{0.5}P$ (0.5<x<1.0) which is 20 to 200 nm thick, a first etch stop layer 212 of p-$Ga_{0.5}In_{0.5}P$ which is nominally 5 nm thick, a third or upper intermediate spacer layer 214 of n-$(Al_xGa_{1-x})_{0.5}In_{0.5}P$ (0.5<x<1.0) which is 20 to 200 nm thick, a second or upper active quantum well layer 216 of $Al_yGa_{1-y}As$ (0<y<0.3) which is 8 to 10 nm thick, a fourth or upper spacer layer 218 of p-$(Al_xGa_{1-x})_{0.5}In_{0.5}P$ (0.5<x<1.0) which is 20 to 200 nm thick, and a protective layer 220 of p-$Ga_{0.5}In_{0.5}P$ or p-GaAs which is 4 to 10 nm thick.

The second active layer 216 is selectively removed from a portion of the monolithic laser structure 200 by stopping after the growth of the protective layer 220 for etching. The thin etch stop layer 212 of GaInP embedded below the upper intermediate spacer layer 214 serves as a stop etch layer and a protective layer for the epitaxial growth of an upper DBR in the etched region. Similarly the protective layer 220 provides an Al-free surface on which to epitaxialy grow the upper DBR in the non-etched region after the selective etching.

A portion 230 of the monolithic laser structure 200 is covered by a mask and the remainder 240 is etched down to the first etch stop layer 212 as is well known in the art, thus removing portions of the protective layer 220, upper spacer layer 218, the second or upper active quantum well layer 216 and the upper intermediate spacer layer 214.

Formation of the monolithic laser structure 200 continues after the etching with removal of the mask and epitaxial deposition upon the protective layer 220 of the non-etched portion and upon the etch stop layer 212 of the etched portion of a second or upper broad bandwidth DBR 224 of alternating layers of p-$Al_{0.5}Ga_{0.5}As$ and p-AlAs, followed by a cap layer 226 of p-GaAs which is 10 to 100 nm thick with a top surface 228.

The first laser cavity 240 is under the etched portion within the monolithic structure 200 and consists of the first etch stop layer 212, the second or lower intermediate spacer layer 210, the first active quantum well layer 208, and the first or lower spacer layer 206. The laser cavity can be formed with one of several different techniques. For example, the embodiment of FIG. 4 illustrates formation of a gain-guided cavity by confining the current with proton bombardment regions 280.

The second laser cavity 230 is under the non-etched portion within the monolithic structure 200 and consists of the protective layer 220, the fourth or upper spacer layer 218, the second active quantum well layer 216, the third or upper intermediate spacer layer 214, the first etch stop layer 212, the second or lower intermediate spacer layer 210, the first active quantum well layer 208, and the first or lower spacer layer 206. The laser cavity can be formed with one of several different techniques. For example, the embodiment of FIG. 4 illustrates formation of a gain-guided cavity by confining the current with proton bombardment regions 290.

Standard evaporation techniques are employed to form metal contacts to the first and second lasers. The p-side of the first laser cavity 240 is contacted over the etched portion of the structure with an annular metal contact 262 of Cr—Au or Ti—Pt—Au on the top surface 228 of the cap layer 226. Contact 294 to the n-side of the first laser cavity 240 is provided by an alloyed Au—Ge metallization, followed by Cr—Au or Ti—Pt—Au, on the bottom surface 296 of the substrate 202.

The p-side of the second laser cavity 230 is contacted over the non-etched portion of the structure with an annular metal contact 260 of Cr—Au or Ti—Pt—Au on the top surface 228 of the cap layer 226. Contact (not shown) to the n-side of the second laser cavity 230 is provided by etching through the upper DBR 224, the protective layer 220, and the upper spacer layer 218 in a region laterally displaced from contact 260. A skin diffusion of an n-type dopant, e.g. silicon, is then performed in this etched region in order to locally dope the active layer and thereby make contact to the underlying n-doped upper intermediate spacer layer 214. Metallization to this region is provided in the standard way with alloyed Au—Ge, followed by Cr—Au or Ti—Pt—Au.

The first active layer 208 of GaInP has a wider bandgap than the second active layer 216 of GaAs or AlGaAs and thus the first active layer 208 will lase at a shorter first wavelength than the second active layer 216. In this illustrative example, the first active layer of GaInP will lase in the red.

The second active layer 216 of GaAs or AlGaAs has a narrower bandgap than the first active layer 208 of GaInP and thus the second active layer 216 will lase at a longer second wavelength than the first active layer 208. In this illustrative example, the second active layer of GaAs or AlGaAs will lase in the infrared.

Voltage applied to the first contact 262 and the common contact 294 will cause the first active quantum well layer 208 of the first laser cavity 240 to emit light of a first wavelength through the emission window in the top surface 228 of the laser structure 200 not covered by the first contact 262. The first cavity 240 only contains the first active quantum well layer 208.

Voltage applied to the second contact 260 and the lateral contact (not shown) to layer 214 will cause the second active quantum well layer 216 of the second laser cavity 230 to emit light of a second wavelength through the emission window in the top surface 228 of the laser structure 200 not covered by the second contact 260.

The second laser cavity 230 contains both the first active quantum well layer 208 and the second active quantum well layer 216. However, only the second active quantum well layer 216 will emit lasing light.

With current applied to both active layers, the second cavity 230 will emit light at the second longer wavelength from the second active layer 216 because the second active layer has the narrower bandgap and the injected carriers preferentially populate the lowest energy active layer in the structure, i.e. the narrowest bandgap active layer.

The distinction between the monolithic laser structure 10 of the first embodiment of FIG. 1 and the monolithic laser structure 200 of the third embodiment of FIG. 4 is that each laser in structure 10 of FIG. 1 contains only one active layer designed for emission at the appropriate wavelength while in structure 200 of FIG. 4 one laser contains active layers emitting at both long and short wavelengths.

The laser cavity length in an edge emitter laser is many thousands of times the wavelength of the emitted light. Exacting precision in the laser cavity length is thus not critical in an edge emitter. On the contrary, the laser cavity length in a surface emitter laser is only a small single digit or low double digit multiple of the wavelength of the emitted light.

Accordingly, the thicknesses of the confinement layers are chosen to place each of the active quantum wells of the first and second active layers at the peak of the cavity's standing wave corresponding to the wavelength emitted by each quantum well. This matching of wavelength and laser cavity length avoids nulls and phase mismatching of the emitted light beam.

Thus, the first active layer 208 is physically positioned in the first cavity 240 at the peak of the standing wave of the red wavelength that the first active layer emits. And, the second active layer 216 is physically positioned in the second cavity 230 at the peak of the standing wave of the infrared wavelength that the second active layer emits. The first and second active layers may be positioned at the peak of their respective standing waves by locating each active layer at the center of its cavity. Alternatively, the second active layer may be positioned at the peak of its standing wave by using a cavity length that is 2 times the wavelength in the semiconductor and placing the active layer at ¼ of the cavity length below the upper DBR. Other asymmetric arrangments are possible for cavities that are integer multiples of the wavelength.

The second active quantum well layer 216 can alternatively comprise GaAsP, InGaAsP, or AlGaAsP, all materials which emit light in the infrared spectrum. Alternatively, the single active quantum wells can be replaced by multiple quantum wells separated by appropriate barrier layers as is well known in the art. Also the upper DBR and lower DBR can comprise alternating layers of InAlP and InAlGaP.

Figure 5:
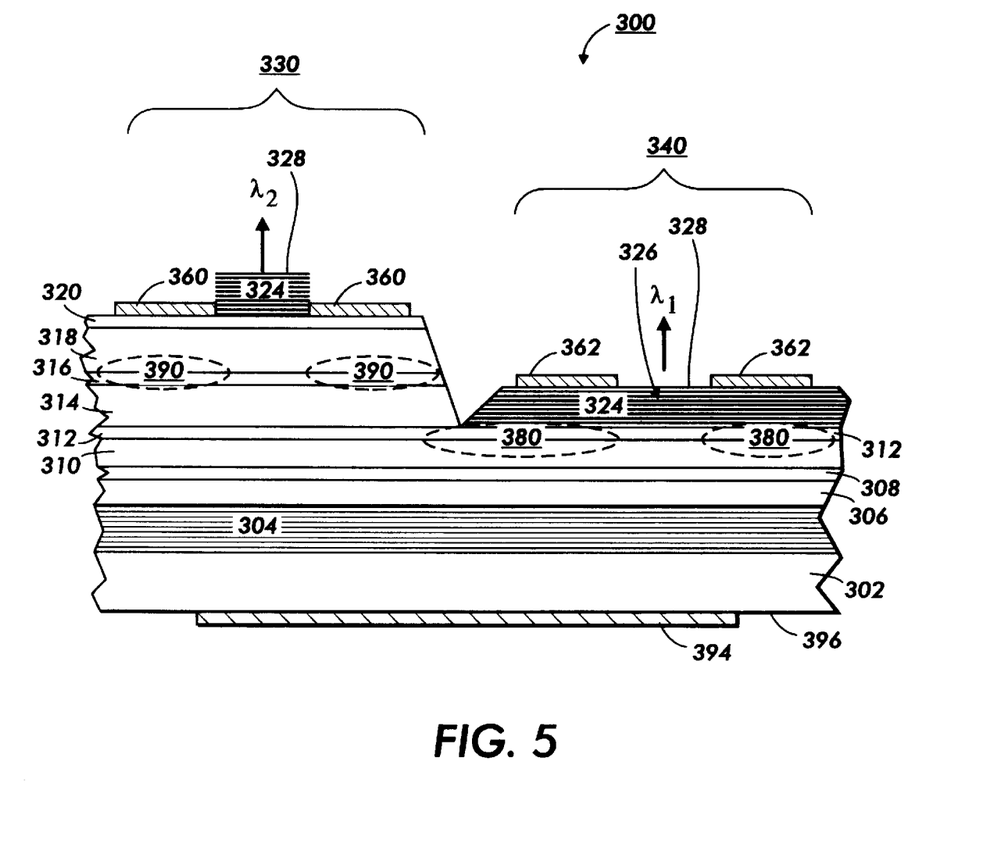
FIG. 5 is a schematic illustration of a cross-section side view of a fourth embodiment of a high density, dual wavelength, surface emitting monolithic laser structure with broad bandwidth Distributed Bragg Reflectors and with opposite doping type for the upper spacer layers formed according to the present invention.

Alternatively, a fourth embodiment of the present invention is illustrated is FIG. 5. The monolithic laser structure 300 comprises a substrate 302 of n-GaAs upon which is epitaxially deposited a first or lower broad bandwidth DBR 304 of alternating layers of n-$Al_{0.5}Ga_{0.5}As$ and n-AlAs, a first or lower spacer layer 306 of n-$(Al_xGa_{1-x})_{0.5}In_{0.5}P$ ($0.5<x<1.0$) which is 20 to 200 nm thick, a first or lower active quantum well layer 308 of $Ga_zIn_{1-z}P$, which is 8 to 10 nm thick, a second or lower intermediate spacer layer 310 of p-$(Al_xGa_{1-x})_{0.5}In_{0.5}P$ ($0.5<x<1.0$) which is 20 to 200 nm thick, a first etch stop layer 312 of p-$Ga_{0.5}In_{0.5}P$ which is nominally 5 nm thick, a third or upper intermediate spacer layer 314 of p-$(Al_xGa_{1-x})_{0.5}In_{0.5}P$ ($0.5<x<1.0$) which is 20 to 200 nm thick, a second or upper active quantum well layer 316 of $Al_yGa_{1-y}As$ ($0<y<0.3$) which is 8 to 10 nm thick, a fourth or upper spacer layer 318 of n-$(Al_xGa_{1-x})_{0.5}In_{0.5}P$ ($0.5<x<1.0$) which is 20 to 200 nm thick, and a protective layer 320 of n-$Ga_{0.5}In_{0.5}P$ or n-GaAs which is 4 to 10 nm thick.

This embodiment differs from the embodiment of FIG. 4 in that the upper intermediate spacer layer 314 and the upper spacer layer 318 of the embodiment of FIG. 5 are beneficially of the opposite doping type from the same layers in the embodiment of FIG. 4.

The second active layer 316 is selectively removed from a portion of the monolithic laser structure 300 by stopping after the growth of the protective layer 320 for etching. A thin protective layer 312 of $Ga_{0.5}In_{0.5}P$ embedded below the upper intermediate spacer layer 314 serves as a stop etch layer and a protective layer for the regrowth of upper DBR. Similarly, the protective layer 320 provides an Al-free surface on which to regrow the upper DBR after the selective etching.

A portion 330 of the monolithic laser structure 300 is covered by a mask and the remainder 340 is etched down to the first etch stop layer 312 as is well known in the art, thus removing portions of the protective layer 320, fourth or upper spacer layer 318, the second or upper active quantum well layer 316 and the third or upper intermediate spacer layer 314.

Formation of the monolithic laser structure 300 continues after the etching with removal of the mask and epitaxial deposition upon the protective layer 320 of the non-etched portion and upon the first etch stop layer 312 of the etched portion of a second or upper broad bandwidth DBR 324 of alternating layers of p-Al$_{0.5}$Ga$_{0.5}$As and p-AlAs, and a cap layer 326 of p-GaAs which is 10 to 100 nm thick with a top surface 328.

Subsequent to growth of the upper broad bandwidth DBR 324, the upper DBR is laterally patterned in order to expose the n-contact layer 320 in laser 330. Similarly, the upper DBR can at the same time be laterally patterned in laser 340 to expose the p etch stop layer 312 for use as a contact layer. For the present embodiment we illustrate the formation of the monolithic laser structure without this patterning in laser 340.

After the upper DBR is patterned, surface emitting laser cavities 340 and 330 are formed by one of several techniques well known in the art. The first laser cavity 340 is under the etched portion within the monolithic structure 300 and consists of the first etch stop layer 312, the second or lower intermediate spacer layer 310, the first active quantum well layer 308, and the first or lower spacer layer 306. The embodiment of FIG. 5 illustrates formation of a gain-guided cavity by confinement of the current with proton bombardment regions 380 without patterning of the upper DBR 324.

The second laser cavity 330 is under the non-etched portion within the monolithic structure 300 and consists of the protective layer 320, the fourth or upper spacer layer 318, the second active quantum well layer 316, the third or upper intermediate spacer layer 314, the first etch stop layer 312, the second or lower intermediate spacer layer 310, the first active quantum well layer 308, and the first or lower spacer layer 306. The laser cavity can be formed with one of several different techniques. For example, the embodiment of FIG. 5 illustrates formation of a gain-guided cavity by confining the current with proton bombardment regions 390 with patterning of the upper DBR.

Standard evaporation techniques are employed to form metal contacts to the first and second lasers. The p-side of the first laser cavity 340 is contacted over the etched portion of the structure with an annular metal contact 362 of Cr—Au or Ti—Pt—Au on the top surface 328 of the cap layer 326. Contact 394 to the n-side of the first laser cavity 340 is provided by an alloyed Au—Ge metallization, followed by Cr—Au or Ti—Pt—Au, on the bottom surface 396 of the substrate 302.

The n-side of the second laser cavity 330 is contacted over the non-etched portion of the structure by laterally patterning the upper p-DBR to expose the underlaying protective layer 320. If needed, a skin diffusion of an n-type dopant, e.g. silicon, is performed to contact the n-type upper spacer layer 318 before applying an annular metal contact 360 of alloyed Au—Ge covered with Cr—Au or Ti—Pt—Au on the exposed surface of the protective layer 320. Contact (not shown) to the p-side of the second laser cavity 330 is provided by etching through the upper DBR 324, the protective layer 320, and the upper intermediate spacer layer 318 in a region laterally displaced from contact 360. A skin diffusion of an p-type dopant, e.g. zinc, is performed in this etched region to contact the p-type intermediate spacer layers 314 and 310 through the undoped second active layer 316. Metallization to this region is provided in the standard way with Cr—Au or Ti—Pt—Au.

Alternatively, the lateral laser structures can be formed before the deposition of the upper DBR.

The distinction between the monolithic laser structure 200 of the third embodiment of FIG. 4 and the monolithic laser structure 300 of the fourth embodiment of FIG. 5 is the doping of the spacer layers 314 and 318 versus the doping of the spacer layers 214 and 218. The structure 300 of FIG. 5 is advantageous compared with the structure 200 of FIG. 4 because layer 314 is the same conductivity type as layer 310. Thus, the total thickness of the buried p-conduction channel is greater in structure 300 than in structure 200 where it is composed of only one layer. Both structures are advantaged compared to the second embodiment of FIG. 3 because only the second active layer draws current in laser 230 of FIG. 4 and in laser 330 of FIG. 5, whereas both active layers draw current in laser 140 of FIG. 3.

The active layers may, in the alternative, be nondoped or p-type doped or n-type doped; GaAs, Al$_y$Ga$_{1-y}$As, GaIn$_{1-z}$P or (Al$_x$Ga$_{1-x}$)$_{0.5}$In$_{0.5}$P; or a relatively thin conventional double heterostructure (DH) active layer; or a single quantum well, such as GaAs or Al$_y$Ga$_{1-y}$As where y is small and y<x; or a multiple quantum well superlattice, such as alternating layers of GaAs and Al$_y$Ga$_{1-y}$As where y<x or alternating layers of Al$_w$Ga$_{1-w}$As and Al$_B$Ga$_{1-B}$As where w<B$\leq$x with a second confinement layer of p-Al$_z$Ga$_{1-z}$As where w<B$\leq$z; or a separate single or multiple quantum well structure in a separate confinement cavity; so long as the bandgaps of the first and second active layers are different and the n-DBR and p-DBR will reflect the wavelengths emitted by both active layers. Alternately, the first active layer and the second active layer can be the same semiconductor material for light emission under lasing conditions but a different thickness yielding different wavelengths.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

I claim:

1. A dual wavelength, surface emitting laser comprising
a monolithic semiconductor structure having a first laser cavity with a first active layer for emitting light of a first wavelength; and a second laser cavity with a second active layer for emitting light of a second wavelength, said second wavelength being longer than said first wavelength,
a first and second broad bandwidth distributed Bragg reflectors in said semiconductor structure, said first and second broad bandwidth distributed Bragg reflectors reflecting light of said first and second wavelengths,
electrodes for passing current through said first and second laser cavities in said semiconductor structure wherein a first electrode thereby causes light emission from said first laser cavity at said first wavelength from said first active layer through said second broad bandwidth distributed Bragg reflector and a second electrode thereby causes light emission from said second laser cavity at said second wavelength from said second active layer through said second broad bandwidth distributed Bragg reflector.

2. The dual wavelength, surface emitting laser of claim 1 wherein said first active layer within said first laser cavity is at the peak of the standing wave corresponding to said first wavelength emitted by said first active layer or an integer multiple of said first wavelength and further wherein said second active layer within said second laser cavity is at the peak of the standing wave corresponding to said second wavelength emitted by said second active layer or an integer multiple of said second wavelength.

3. The dual wavelength, surface emitting laser of claim 1 wherein said first and second active layers have different bandgaps.

4. The dual wavelength, surface emitting laser of claim 1 wherein said first active layer is AlGaAs or GaAs and said second active layer is AlGaInP or GaInP.

5. The dual wavelength, surface emitting laser of claim 1 wherein said first and second wavelengths are separated by at least 50 nanometers.

6. The dual wavelength, surface emitting laser of claim 1 further comprising a phase matching semiconductor layer in said second laser cavity.

7. A dual wavelength, surface emitting laser comprising
a monolithic semiconductor structure having a first laser cavity with a first active layer for emitting light of a first wavelength; and a second laser cavity with said first active layer and a second active layer for emitting light of a second wavelength, said second wavelength being longer than said first wavelength,
a first and second broad bandwidth distributed Bragg reflectors in said semiconductor structure, said first and second broad bandwidth distributed Bragg reflectors reflecting light of said first and second wavelengths,
electrodes for passing current through said first and second laser cavities in said semiconductor structure wherein a first electrode thereby causes light emission from said first laser cavity at said first wavelength from said first active layer through said second broad bandwidth distributed Bragg reflector and a second electrode thereby causes light emission from said second laser cavity at said second wavelength from said second active layer through said second broad bandwidth distributed Bragg reflector.

8. The dual wavelength, surface emitting laser of claim 7 wherein said first active layer within said first laser cavity is at the peak of the standing wave corresponding to said first wavelength emitted by said first active layer or an integer multiple of said first wavelength and further wherein said second active layer within said second laser cavity is at the peak of the standing wave corresponding to said second wavelength emitted by said second active layer or an integer multiple of said second wavelength.

9. The dual wavelength, surface emitting laser of claim 7 wherein said second active layer has been etched away from said first laser cavity.

10. The dual wavelength, surface emitting laser of claim 7 wherein said first and second active layers have different bandgaps.

11. The dual wavelength, surface emitting laser of claim 7 wherein said first active layer is AlGaAs or GaAs and said second active layer is AlGaInP or GaInP.

12. The dual wavelength, surface emitting laser of claim 7 wherein said first and second wavelengths are separated by at least 50 nanometers.

13. The dual wavelength, surface emitting laser of claim 7 further comprising a phase matching semiconductor layer in said second laser cavity.

14. A dual wavelength, surface emitting laser comprising
a substrate,
a first broad bandwidth distributed Bragg reflector deposited on said substrate, said first broad bandwidth distributed Bragg reflector reflecting light of a first and second wavelengths,
a first etch stop layer deposited on said first broad bandwidth distributed Bragg reflector,
a first spacer layer deposited on said first etch stop layer,
a first active layer deposited on said first spacer layer, said first active layer for emitting light of a first wavelength,
a second spacer layer deposited on said first active layer,
a first cap layer partially covering said second spacer layer, wherein said second spacer layer, said first active layer and said first spacer layer are etched down to said first etch stop layer in the region not covered with said first cap layer,
a third spacer layer deposited on said first etch stop layer,
a second active layer deposited on said third spacer layer, said second active layer for emitting light of a second wavelength, said second wavelength being longer than said first wavelength,
a fourth spacer layer deposited on said second active layer,
a second cap layer deposited on said fourth spacer layer, wherein a first laser cavity is formed from said first etch stop layer, said first spacer layer, said first active layer, said second spacer layer and said first cap layer and further wherein a second laser cavity is formed from said first etch stop layer, said third spacer layer, said second active layer, said fourth spacer layer and said second cap layer,
a second broad bandwidth distributed Bragg reflector deposited on said second cap layer and on said first cap layer, said second broad bandwidth distributed Bragg reflector reflecting light of a first and second wavelengths,
a common electrode deposited on said substrate on the opposite side from said first broad bandwidth distributed Bragg reflector,
at least a first electrode deposited on said first cap layer for passing current through said first active layer in said first laser cavity thereby causing light emission at said first wavelength from said first active layer through said second broad bandwidth distributed Bragg reflector, and
at least a second electrode deposited on said second cap layer for passing current through said second active layer in said second laser cavity thereby causing light emission at said second wavelength from said second active layer through said second broad bandwidth distributed Bragg reflector.

15. The dual wavelength, surface emitting laser of claim 14 wherein said first active layer within said first laser cavity is at the peak of the standing wave corresponding to said first wavelength emitted by said first active layer or an integer multiple of said first wavelength and further wherein said second active layer within said second laser cavity is at the peak of the standing wave corresponding to said second wavelength emitted by said second active layer or an integer multiple of said second wavelength.

16. The dual wavelength, surface emitting laser of claim 14 wherein said first and second active layers have different bandgaps.

17. The dual wavelength, surface emitting laser of claim 14 wherein said first active layer is AlGaAs or GaAs and said second active layer is AlGaInP or GaInP.

18. The dual wavelength, surface emitting laser of claim 14 wherein said first and second wavelengths are separated by at least 50 nanometers.

19. A dual wavelength, surface emitting laser comprising
a substrate,
a first broad bandwidth distributed Bragg reflector deposited on said substrate, said first broad bandwidth distributed Bragg reflector reflecting light of a first and second wavelengths, a first spacer layer deposited on said first broad bandwidth distributed Bragg reflector, a first active layer deposited on said first spacer layer, said first active layer for emitting light of a first wavelength, a second spacer layer deposited on said first active layer, a first etch stop layer deposited on said second spacer layer, a third spacer layer deposited on said first etch stop layer, a second active layer deposited on said third spacer layer, said second active layer for emitting light of a second wavelength, said second wavelength being longer than said first wavelength, a fourth spacer layer deposited on said second active layer, a protective layer partially covering said fourth spacer layer, wherein said fourth spacer layer, said second active layer and said third spacer layer are etched down to said first etch stop layer in the region not covered with said protective layer, wherein a first laser cavity is formed from said first etch stop layer, said second spacer layer, said first active layer, and said first spacer layer under the region not covered with said protective layer, and further wherein a second laser cavity is formed from said protective layer, said fourth spacer layer, said second active layer, said third spacer layer, said first etch stop layer, said second spacer layer, said first active layer, and said first spacer layer under the region covered with said protective layer, a second broad bandwidth distributed Bragg reflector deposited on said protective layer and on said first etch stop layer, said second broad bandwidth distributed Bragg reflector reflecting light of a first and second wavelengths, a cap layer deposited on said second broad bandwidth distributed Bragg reflector, at least a first cathode and a first anode formed for passing current through said first active layer in said first laser cavity thereby causing light emission at said first wavelength from said first active layer through said second broad bandwidth distributed Bragg reflector, and at least a second cathode and a second anode formed for passing current through said second active layer in said second laser cavity thereby causing light emission at said second wavelength from said second active layer through said second broad bandwidth distributed Bragg reflector.

20. The dual wavelength, surface emitting laser of claim 19 wherein said second spacer layer and said third spacer layer have opposite doping types.

21. The dual wavelength, surface emitting laser of claim 19 wherein said first active layer within said first laser cavity is at the peak of the standing wave corresponding to said first wavelength emitted by said first active layer or an integer multiple of said first wavelength and further wherein said second active layer within said second laser cavity is at the peak of the standing wave corresponding to said second wavelength emitted by said second active layer or an integer multiple of said second wavelength.

22. The dual wavelength, surface emitting laser of claim 19 wherein said first and second active layers have different bandgaps.

23. The dual wavelength, surface emitting laser of claim 19 wherein said first active layer is AlGaAs or GaAs and said second active layer is AlGaInP or GaInP.

24. The dual wavelength, surface emitting laser of claim 19 wherein said first and second wavelengths are separated by at least 50 nanometers.

25. A dual wavelength, surface emitting laser comprising a substrate, a first broad bandwidth distributed Bragg reflector deposited on said substrate, said first broad bandwidth distributed Bragg reflector reflecting light of a first and second wavelengths, a first spacer layer deposited on said first broad bandwidth distributed Bragg reflector, a first active layer deposited on said first spacer layer, said first active layer for emitting light of a first wavelength, a second spacer layer deposited on said first active layer, a first etch stop layer deposited on said second spacer layer, a third spacer layer deposited on said first etch stop layer, a second active layer deposited on said third spacer layer, said second active layer for emitting light of a second wavelength, said second wavelength being longer than said first wavelength, a fourth spacer layer deposited on said second active layer, a protective layer partially covering said fourth spacer layer, wherein said fourth spacer layer, said second active layer and said third spacer layer are etched down to said first etch stop layer in the region not covered with said protective layer, wherein a first laser cavity is formed from said first etch stop layer, said second spacer layer, said first active layer, and said first spacer layer under the region not covered with said protective layer, and further wherein a second laser cavity is formed from said protective layer, said fourth spacer layer, said second active layer, said third spacer layer, said first etch stop layer, said second spacer layer, said first active layer, and said first spacer layer under the region covered with said protective layer, a second broad bandwidth distributed Bragg reflector deposited on said protective layer and on said first etch stop layer, said second broad bandwidth distributed Bragg reflector reflecting light of a first and second wavelengths, a cap layer deposited on said second broad bandwidth distributed Bragg reflector, at least a first electrode deposited on said substrate on the opposite side from said first broad bandwidth distributed Bragg reflector, a second electrode deposited on said cap layer for passing current through said first active layer in said first laser cavity thereby causing light emission at said first wavelength from said first active layer through said second broad bandwidth distributed Bragg reflector, and at least a third electrode deposited on said third spacer layer and a fourth electrode deposited on said cap layer for passing current through said second active layer in said second laser cavity thereby causing light emission at said second wavelength from said second active layer through said second broad bandwidth distributed Bragg reflector.

26. The dual wavelength, surface emitting laser of claim 25 wherein said second spacer layer and said third spacer layer have opposite doping types.

27. The dual wavelength, surface emitting laser of claim 25 wherein said first active layer within said first laser cavity is at the peak of the standing wave corresponding to said first wavelength emitted by said first active layer or an integer multiple of said first wavelength and further wherein said second active layer within said second laser cavity is at the peak of the standing wave corresponding to said second wavelength emitted by said second active layer or an integer multiple of said second wavelength.

28. The dual wavelength, surface emitting laser of claim 25 wherein said first and second active layers have different bandgaps.

29. The dual wavelength, surface emitting laser of claim 25 wherein said first active layer is AlGaAs or GaAs and said second active layer is AlGaInP or GaInP.

30. The dual wavelength, surface emitting laser of claim 25 wherein said first and second wavelengths are separated by at least 50 nanometers.

* * * * *